United States Patent
Suzuki

(10) Patent No.: US 6,563,125 B1
(45) Date of Patent: May 13, 2003

(54) CHARGED-PARTICLE-BEAM MICROLITHOGRAPHY APPARATUS AND METHODS FOR PREVENTING COULOMB EFFECTS USING THE HOLLOW-BEAM TECHNIQUE

(75) Inventor: Shohei Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/575,211

(22) Filed: May 18, 2000

(30) Foreign Application Priority Data

May 18, 1999 (JP) .......................... 11-136935

(51) Int. Cl.⁷ .................. G21G 5/00; G21K 5/10; H01J 25/14; A61N 5/00
(52) U.S. Cl. ................ 250/492.21; 250/492.1; 250/492.2; 250/492.22; 250/492.23; 250/492.3; 250/396 R; 315/5.31
(58) Field of Search .............. 250/400, 492, 250/398, 492.2, 492.1, 492.21, 492.22, 492.23, 492.3, 396 R; 313/439, 432, 434; 315/5.31

(56) References Cited

U.S. PATENT DOCUMENTS

| | | | |
|---|---|---|---|
| 5,329,333 A | * 7/1994 | Noguchi et al. | 355/53 |
| 5,631,110 A | * 5/1997 | Shioiri et al. | 430/22 |
| 5,701,014 A | * 12/1997 | Berger et al. | 250/492.22 |
| 5,821,542 A | * 10/1998 | Golladay | 250/396 R |
| 6,218,676 B1 | * 4/2001 | Nakasuji | 250/396 R |
| 6,222,197 B1 | * 4/2001 | Kojima | 250/396 ML |
| 6,326,633 B2 | * 12/2001 | Nakasuji | 250/396 R |
| 6,429,441 B1 | * 8/2002 | Nakasuji | 250/397 |
| 6,441,384 B1 | 8/2002 | Kojima | |
| 2001/0008274 A1 | * 7/2001 | Nakasuji | 250/492.3 |
| 2001/0010362 A1 | * 8/2001 | Simizu | 250/396 R |
| 2001/0028037 A1 | * 10/2001 | Suzuki | 250/396 R |

FOREIGN PATENT DOCUMENTS

| | | | | |
|---|---|---|---|---|
| JP | 9-237363 | * | 9/1997 | ......... H01L/21/027 |
| JP | 10-111357 | * | 4/1998 | ......... H01L/21/027 |
| JP | 11297610 | * | 10/1999 | ......... H01L/21/027 |

* cited by examiner

Primary Examiner—John R. Lee
Assistant Examiner—Bernard E. Souw
(74) Attorney, Agent, or Firm—Klarquist Sparkman LLP

(57) ABSTRACT

Apparatus and methods are disclosed for charged-particle-beam (CPB) microlithography using a hollow beam. The hollow beam is produced by passing the charged particle beam through a scattering aperture. However, passage of the beam is performed in a manner by which the scattering aperture is prevented from overheating. Also, the scattering aperture can be made from a material that is micro-machined easily. The scattering aperture can be configured as a beam-scattering aperture plate defining voids that collectively define an annular aperture. The scattering aperture is situated at a beam-crossover plane. As the charged particle beam strikes the scattering aperture, particles pass readily through the voids as a "transmitted beam." Particles incident on the scattering aperture plate are scattered and become a "scattered beam." The transmitted beam passes readily through a downstream blocking aperture, whereas most particles of the scattered beam are absorbed by the blocking aperture.

9 Claims, 3 Drawing Sheets

CHARGED-PARTICLE-BEAM MICROLITHOGRAPHY APPARATUS AND METHODS FOR PREVENTING COULOMB EFFECTS USING THE HOLLOW-BEAM TECHNIQUE

FIELD OF THE INVENTION

This invention pertains to microlithography (projection-exposure) of a pattern, defined by a reticle or mask, onto a sensitive substrate such as a semiconductor wafer using a charged particle beam such as an electron beam or ion beam. Microlithography is a key technology used in the fabrication of semiconductor integrated circuits, displays, and the like. More specifically, the invention pertains to charged-particle-beam (CPB) microlithography apparatus and methods in which image defocusing and distortion caused by Coulomb effects are reduced.

BACKGROUND OF THE INVENTION

As the degree of integration of semiconductor integrated circuits has increased in recent years, more intricate circuit patterns have been demanded. As the desired minimum linewidth in circuit patterns has fallen to 0.1 μm and below, the inability of optical microlithography to provide acceptable resolution is apparent. Consequently, substantial research currently is being devoted to the development of a practical charged-particle-beam (CPB) microlithography apparatus that can provide the desired pattern resolution at a satisfactory throughput.

Initial efforts in this regard were directed to CPB microlithography systems that performed exposure of an entire chip pattern ("die"), or even multiple dies, in one "shot." Such systems currently are impractical because of the extreme difficulty of preparing a reticle that can be exposed in one shot and of maintaining aberrations below necessary levels within a CPB-optical field sufficiently large to accommodate an entire die or multiple dies.

As an alternative to "one-shot" CPB microlithography systems, so-called "divided-reticle" CPB microlithography systems are being investigated actively. In a divided-reticle system, rather than exposing an entire die or multiple dies at one time, a die as defined on the reticle is divided into small regions (e.g., "subfields") each measuring about several hundred μm square, and the small regions are exposed sequentially in an ordered manner to effect exposure of an entire die. During exposure of each small region, correction of exposure parameters can be made as required, such as correction of focus and distortion of the image being formed on the substrate ("wafer"). Thus, exposure can be performed with good resolution, accuracy, and precision over an even wider area than obtainable using a one-shot system.

CPB microlithography systems are subject to certain problems such as defocusing and distortion of the image due to Coulomb effects. A Coulomb effect is caused whenever neighboring charged particles in the charged particle beam repel one another sufficiently to disturb the trajectories of the charged particles in the beam. Particles having disturbed trajectories degrade the image. Coulomb effects are also exhibited by divided-reticle systems. Current attempts to reduce Coulomb effects include adjusting focus by altering the electrical current supplied to a refocus lens, etc. However, Coulomb effects cause not only shifts in focal point but also distortion of the image as projected onto the wafer.

An example of a CPB-optical system exhibiting reduced distortion caused by Coulomb effects and that includes three focus lenses and two stigmators is disclosed in Japan Kôkai Patent Application No. Hei 11-87208 (1999). Whereas this CPB-optical system exhibits reduced lower-order distortion, higher-order distortion is not corrected satisfactorily. Also, because this system performs correction of focus and distortion for each subfield as projected, this system is complicated. Furthermore, the subfield-by-subfield corrections require substantial time for performing the necessary measurements and calculations.

According to another conventional approach to reducing Coulomb effects, distortion that otherwise would be created by Coulomb effects is estimated or measured in advance and the reticle pattern is distorted deliberately so as to achieve, when the subfields are exposed, an offsetting distortion. However, as with the other approach summarized above, the Coulomb distortion has to be calculated or measured in advance, which adds complexity and processing time.

Another conventional approach that offers prospects of overcoming certain of the lingering problems involves shaping the charged particle beam to have a ring-shaped transverse profile (i.e., a "hollow beam"). This approach is disclosed in Japanese Kôkai Patent Application No. Hei 11-297610 (1999). For example, FIGS. 4(a)–4(b) herein depict this approach for forming a hollow beam. An annular aperture 24 is provided by defining segmented voids 25B into a plate 25A made of molybdenum or tungsten. The segmented voids 25B collectively define an essentially annular void. The axis of the annular void is coincident with the CPB axis (i.e., in the middle of the beam 21). As the beam 21 strikes the plate 25A, portions of the beam incident at a segmented void 25B are transmitted through the plate 25A; all other portions of the beam are blocked (scattered and/or absorbed) by the plate 25A. The portions 22 of the beam passing through the segmented voids 25B are used for illuminating the reticle (located downstream) and for transferring the pattern. The annular aperture 24 is disposed at a crossover plane A at which the beam is narrowly constricted.

A conventional CPB-optical system (specifically an electron-beam system) utilizing an annular aperture 24 as summarized above is shown in FIG. 5. The FIG. 5 system is essentially as disclosed in the JP 11-297610 reference cited above. An electron beam 21 emitted from an electron source 26 passes through an "illumination-optical system" comprising illumination lenses 27, 28, and strikes the annular aperture 24. A field-limiting aperture 29 is used to shape the beam 21 so as to illuminate a desired shape (e.g., square) of subfield on the reticle 33. The field-limiting aperture 29 is situated at an axial location that is conjugate with the electron-emission surface of the source 26, with respect to the illumination-optical system. An image of a first crossover 30 (near the source 26) is formed by the illumination lenses 27, 28 on the annular aperture 24. I.e., the annular aperture 24 is disposed at a crossover position. The hollow beam 22 passing through the annular aperture 24 passes through a third illumination lens 32. The third illumination lens 32 forms an image of the electron-emission surface of the source 26 on the reticle 33, thereby illuminating the reticle 33. The field-limiting aperture 29 is situated at an axial position that is conjugate with the reticle 33, with respect to the lens system comprised of the illumination lenses 28, 32. An image of the illuminated portion (subfield) of the reticle 33 is formed on the wafer 36 by projection lenses 34, 35 collectively constituting an "projection-optical system." A contrast aperture 37 is situated so as to block particles of the beam that are scattered by passage through the reticle 33.

Coulomb effects are diminished using the FIG. 5 system as a result of shaping the beam 21 into a hollow beam 22 before the hollow beam 22 irradiates the reticle 33. However, manufacturing the annular aperture 24 for use in the FIG. 5 system is problematic. Namely, the diameter of the crossover at which the annular aperture 24 is placed normally is several hundred μm. Whenever an annular aperture (defined by a plate several hundred μm thick) is placed at such a position, the temperature of the plate can reach several thousand degrees C during use. Hence, the material used to make the annular aperture 24 is limited to high-temperature metals such as molybdenum or tungsten. It is extremely difficult to fabricate the necessary voids, having dimensions in micrometers, in molybdenum or tungsten stock that is several hundred μm thick. Also, the high operating temperatures experienced in the vicinity of the annular aperture during use causes detrimental thermal instability in the CPB-optical system.

Summary of the Invention

In view of the shortcomings of the prior art as summarized above, an object of the invention is to provide a hollow-beam CPB microlithography apparatus in which heating of the annular aperture to high temperature during use is prevented. Another object is to provide methods for fabricating a suitable annular aperture from easily worked materials.

According to a representative embodiment, a system is provided for producing a hollow illumination beam in a CPB microlithography apparatus. The system comprises a scattering aperture several micrometers thick situated at a crossover-image plane of the illumination-optical system.

The scattering aperture can be configured as voids defined in a beam-scattering plate. The voids are arranged in a region of the plate having a first radius equal to a radius of a central region of the plate and a second radius greater than the first radius. Thus, a hollow beam is formed downstream of the scattering aperture as the beam passes through the voids. Alternatively, the scattering aperture can be configured as one or more openings in a layer of CPB-scattering material on a relatively CPB-transmissive membrane. The opening(s) can be configured similarly to the voids summarized above or can have a full-ring (donut) profile.

The system also comprises a blocking aperture situated between the scattering aperture and the reticle. The blocking aperture desirably is configured as a plate defining a central void. The plate is configured to absorb charged particles of the beam that were scattered by passage through the scattering aperture.

As noted above, the scattering aperture is made from a plate that scatters rather than absorbs charged particles. Because few charged particles are absorbed, the plate is not heated to a high temperature during use. This allows the scattering aperture to be made of a more easily micromachined material (e.g., silicon) that does not have to withstand high temperature during use. Even though charged particles scattered by the scattering aperture are absorbed downstream by the blocking aperture, the beam at the blocking aperture is more spread out, which substantially lessens the beam-current density impinging on any given area of the blocking aperture. (For example, the beam-current density on the blocking aperture is about ¹⁄₁₀ the beam-current density on the scattering aperture, which is located at a crossover.) Also, the thickness of the plate defining the blocking aperture can be several mm thick. As a result, the blocking aperture is heated during use to a temperature of only several hundred degrees C.

The lower operating temperatures of both apertures solves the above-summarized problems experienced with prior-art apparatus that include apertures that undergo heating to substantially higher temperatures during use.

The scattering aperture is placed near the crossover because the illumination-optical system normally is configured so that a relationship of beam intensity versus lateral distance from the optical axis at the crossover is similar to the relationship of beam intensity versus angle of incidence at the reticle surface. Because of this relationship, if the scattering aperture is placed at the crossover, then the charged particles of the beam will strike the reticle surface at a nearly constant angle of incidence with no loss of illumination uniformity.

"Near" the crossover means that the position of the scattering aperture may be separated to some extent from the crossover position. The amount of separation that is acceptable can be determined by a person of ordinary skill in the art according to the illumination uniformity demanded.

Since an object is to form a hollow beam before the beam strikes the reticle (while scattering and absorbing other parts of the original beam), it will be appreciated readily that such a beam can be produced even if the voids in the scattering aperture are, for example, segments of a polygon rather than segments of a ring.

A system according to the invention can include a current-limiting aperture situated upstream of the scattering aperture. The current-limiting aperture is configured to pre-absorb particles of the charged particle beam at an edge of the beam. With such a configuration, the thermal load on the scattering aperture is alleviated since the charged particles of the beam at the beam edges are absorbed by the current-limiting aperture before the particles enter the scattering aperture.

The system also can include a scattered-particle-absorbing aperture, configured as a particle-absorbing plate defining a central void, and configured to be situated between the blocking aperture and the reticle. Such an aperture effectively absorbs scattered charged particles of the beam that passed through the scattering aperture. If necessary, multiple scattered-particle-absorbing apertures.

According to another aspect of the invention, CPB microlithography apparatus are provided that comprise a system, as summarized above, for producing a hollow illumination beam. According to yet another aspect of the invention, methods are provided for manufacturing a semiconductor device. Such a method comprises performing projection-transfer of a pattern, defined by a reticle, onto a wafer using a charged-particle-beam microlithography apparatus as summarized above. Since Coulomb effects are diminished substantially, image defocusing and distortion can be reduced without decreasing the beam current. Hence, semiconductor devices can be manufactured with high resolution and high accuracy without decreasing throughput.

In any event, a system according to the invention effectively solves the problems inherent to the JP 11-297610 apparatus, while preserving the benefits of an apparatus according to that reference.

The foregoing and additional features and advantages of the invention will be more readily apparent from the following detailed description, which proceeds with reference to the accompanying drawings.

BRIEF DESCRIPTION OF THE DRAWINGS

FIG. 1(a) is an elevational schematic view showing use of the scattering aperture, and FIG. 1(b) is a plan view of the scattering aperture.

FIG. 4(a) is an elevational schematic view showing use of the annular aperture, and FIG. 4(b) is a plan view of the annular aperture.

DETAILED DESCRIPTION

Figure 1A:
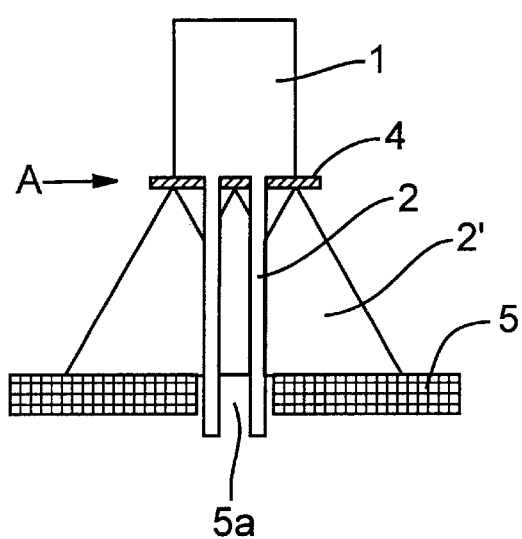
FIGS. 1(a)–1(b) depict a representative embodiment of a scattering aperture, according to the invention, as used to produce a hollow charged particle beam.
Figure 1B:
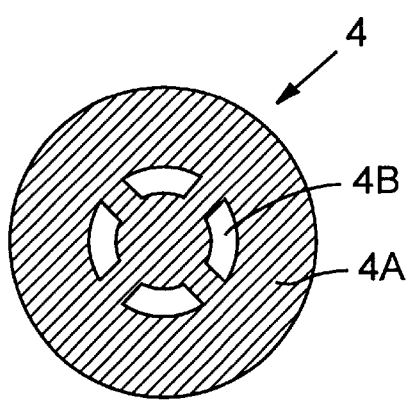

A representative embodiment of a "scattering aperture" according to the invention is shown in FIGS. 1(a)–1(b). Turning first to FIG. 1(b), the scattering aperture 4 comprises a plate 4A made of a CPB-scattering material. The plate 4A defines aperture segments ("voids") 4B that, in FIG. 1(b), collectively define essentially a ring-shaped aperture. The plate 4A can be silicon that is several micrometers thick. The aperture segments 4B are produced by micromachining a silicon wafer using conventional techniques as used in semiconductor manufacturing.

Turning now to FIG. 1(a), a charged particle beam 1 is incident on the scattering aperture 4 situated at a crossover plane A. Particles of the beam 1 passing through the void segments 4B become the transmitted hollow beam 2. Particles of the beam 1 that impact the plate 4A are scattered as they pass though the plate 4A and become the "scattered beam" 2'. The transmitted hollow beam 2 passes readily through a blocking aperture 5 located downstream of the scattering aperture 4. Most of the scattered beam 2' is blocked by the blocking aperture 5. Specifically, the scattered beam 2' is absorbed by the blocking aperture 5.

The blocking aperture 5 defines a central void 5a and is situated between the scattering aperture 4 and the reticle 13. The blocking aperture 5 desirably is formed of a material that can withstand high temperatures (at least several hundred degrees C) and is several mm or more thick. The central void 5a has a diameter sufficiently large so as not to impede passage of the transmitted hollow beam 2.

As can be seen in FIG. 1(a), some of the scattered beam 2' "leaks" through the void 5a in the blocking aperture 5. However, the number of charged particles of the scattered beam 2' leaking through is relatively small. Also, because the leaking particles are scattered, they pose no significant problem to pattern transfer. Furthermore, the number of such scattered particles reaching the reticle 13 can be reduced to substantially zero by adding one or more additional particle-absorbing apertures between the annular scattering aperture 4 and the reticle 13.

Figure 2:
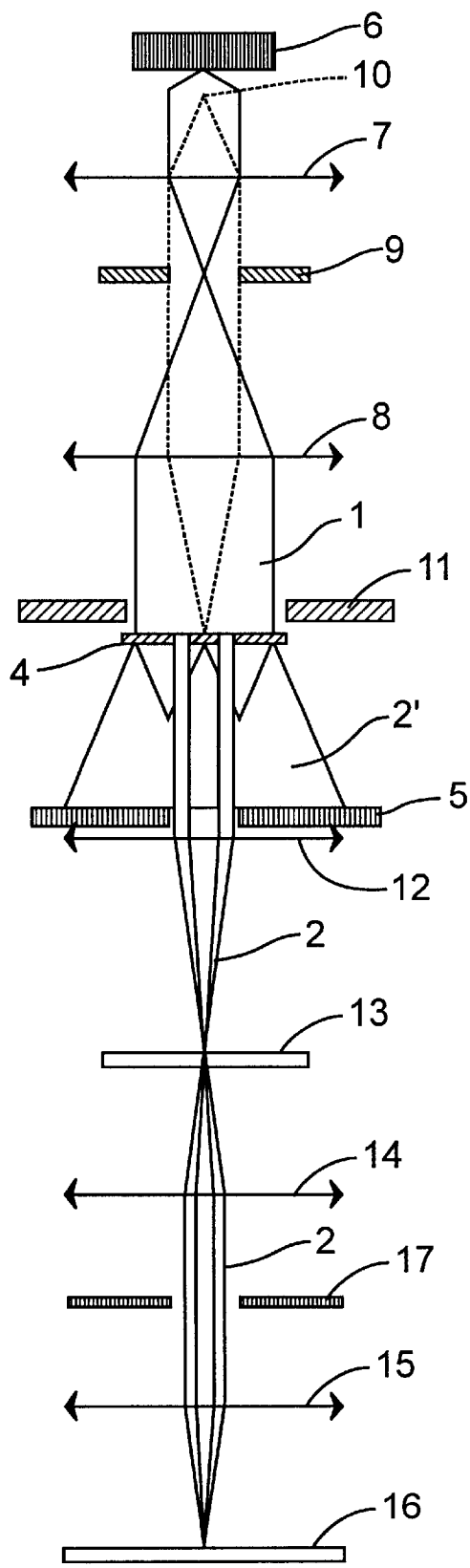
FIG. 2 is an elevational schematic diagram of an embodiment of a charged-particle-beam (CPB) microlithography system with which a scattering aperture according to the invention can be used.

An exemplary embodiment of a CPB microlithography system (e.g., electron-beam system) comprising the scattering aperture 4 and blocking aperture 5, as described above, is shown in FIG. 2. Components in FIG. 2 that are the same as described above have the same respective reference numerals and are not described further. An electron beam 1 is produced by an electron-beam source 6 (e.g., electron gun). The beam 1 passes through illumination lenses 7, 8 between which is a field-limiting aperture 9. A first beam crossover 10 is situated just downstream of the source 6. Downstream of the second illumination lens 8 is a current-limiting aperture 11. After passing through the current-limiting aperture 11, the beam 1 passes through the scattering aperture 4, the blocking aperture 5, and a third illumination lens 12 to the reticle 13. (The components located between the source 6 and the reticle 13 collectively are termed the "illumination-optical system.") Electrons passing through the reticle 13 pass through first and second projection lenses 14, 15, respectively, to the wafer 16. Between the first and second projection lenses 14, 15 is a contrast aperture 17. (The components located between the reticle 13 and the wafer 16 collectively are termed the "projection-optical system.")

The electron beam 1 emitted from the source 6 passes through the illumination lenses 7, 8 to the scattering aperture 4. The field-limiting aperture 9, which restricts the optical field illuminated by the beam 1 and shapes the beam, is situated at a position that is conjugate with the electron-emission surface in the electron source 6, with respect to the lens system consisting of the illumination lenses 7, 8.

An image of the first crossover 10 is formed at the scattering aperture 4 by the illumination lenses 7, 8, as shown in FIG. 1(a). In other words, the scattering aperture 4 is disposed at a crossover position A of the illumination-optical system.

The current-limiting aperture 11 is disposed upstream of the scattering aperture 4. The current-limiting aperture 11 pre-clips the edges of the electron beam 1 that were spread at the crossover, thereby alleviating the thermal load on the scattering aperture 4. The hollow beam 2 transmitted through the scattering aperture 4 forms an image of the electron-emission surface of the source 6 on the reticle 13 by means of the third illumination lens 12. The third illumination lens 12 achieves uniform illumination of the irradiated region of the reticle 13. The size and profile of the irradiated region is determined by the field-limiting aperture 9, which is disposed at an axial position that is conjugate with the reticle 13, with respect to the lens system consisting of the illumination lenses 8 and 12.

As discussed above, most of the scattered electron beam 2' from the scattering aperture 4 is absorbed by the blocking aperture 5.

An image of the irradiated region (e.g., subfield) on the reticle 13 is formed on the wafer 16 by means of the projection lenses 14, 15. The contrast aperture 17 blocks particles of the beam 2 that were scattered by the reticle 13 (which can be a membrane type or a scattering-stencil type). Since the beam 2 is hollow before it irradiates the reticle 13 in this embodiment, Coulomb effects are reduced, thereby reducing image defocusing and distortion on the wafer 36, without having to reduce beam current. Consequently, this embodiment advantageously increases image resolution and pattern-transfer accuracy without decreasing throughput. In actual practice, image focal-point shift is reduced to less than several micrometers and image distortion is maintained at less than several nanometers.

As noted above, although not shown in FIG. 2, multiple apertures may be disposed above the reticle 13 (but downstream of the apertures 4, 5) to block passage of particles in the scattered beam 2' that were not absorbed by the blocking aperture 5.

Figure 3A:
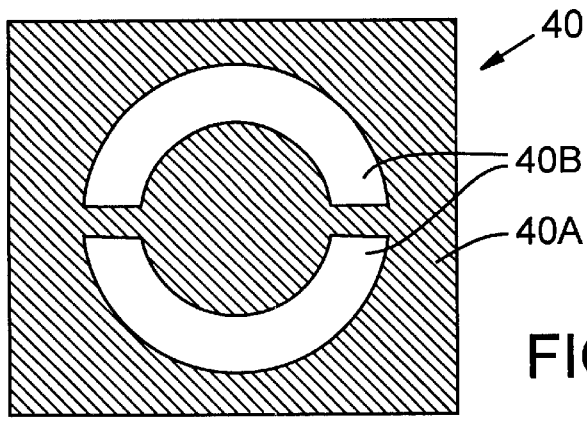
FIGS. 3(a)–3(b) are plan views of respective alternative configurations of a scattering aperture according to the invention.
Figure 3B:
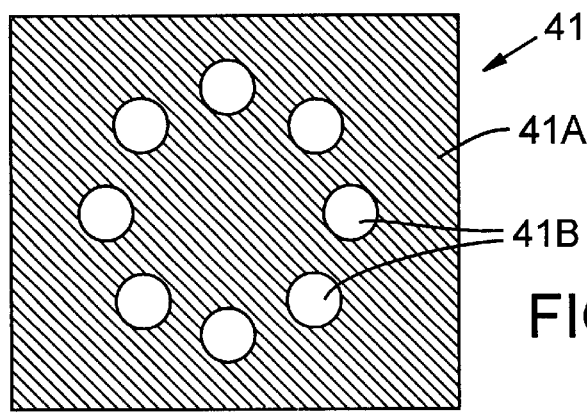

Exemplary alternative embodiments 40, 41 of the scattering aperture 4 are shown in FIGS. 3(a)–3(b), respectively, which are similar to FIGS. 8 and 9, respectively, of the JP Hei 11-297610 reference cited above. In FIG. 3(a), two half-ring-shaped void segments 40B, defined by the plate 40A, collectively define an essentially annular void. In FIG. 3(b), multiple small round void segments 41B, arranged in a bolt circle, collectively define an essentially annular void. Other configurations of void segments are also possible so long as the resulting scattering aperture effectively scatters particles of the beam incident within a central circular area having a first radius and transmits particles of the beam incident within an area outside the central region and having a first radius greater than the radius of the central region but also having a second radius greater than the first radius. The beam-transmitting area is surrounded by a beam-scattering area.

Figure 3C:
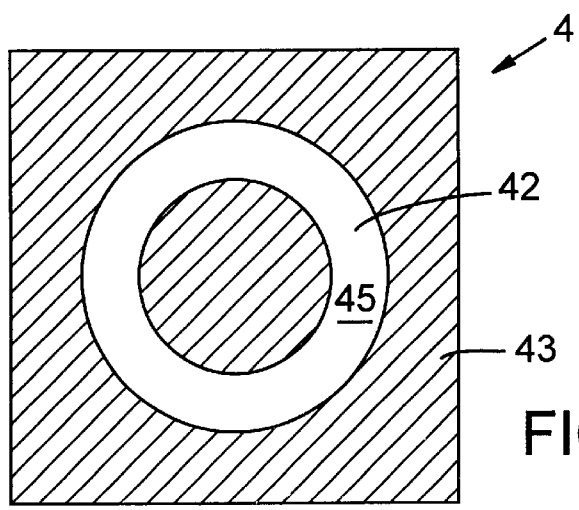
FIGS. 3(c)–3(d) are a plan view and elevational section, respectively, of an alternative configuration of a scattering aperture according to the invention.
Figure 3D:
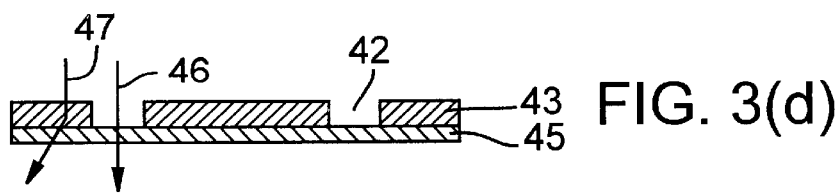
Figure 4A:
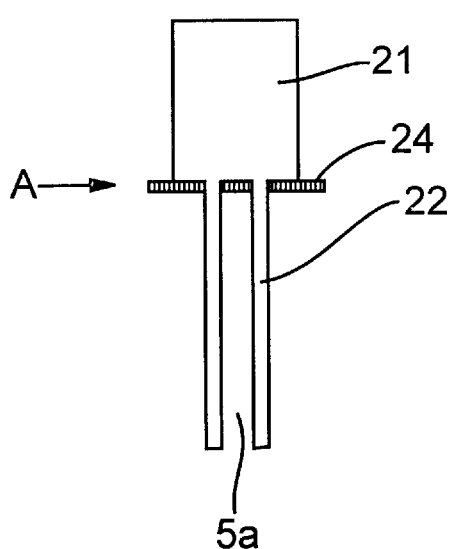
FIGS. 4(a)–4(b) depict a conventional annular aperture as used to produce a hollow charged particle beam.
Figure 4B:
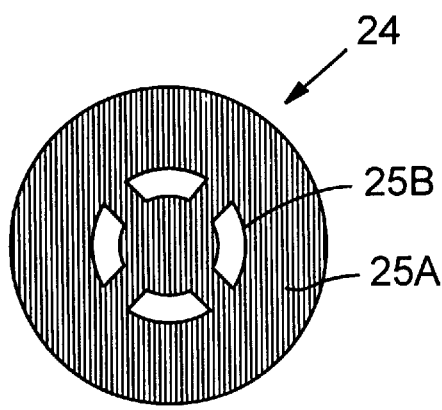
Figure 5:
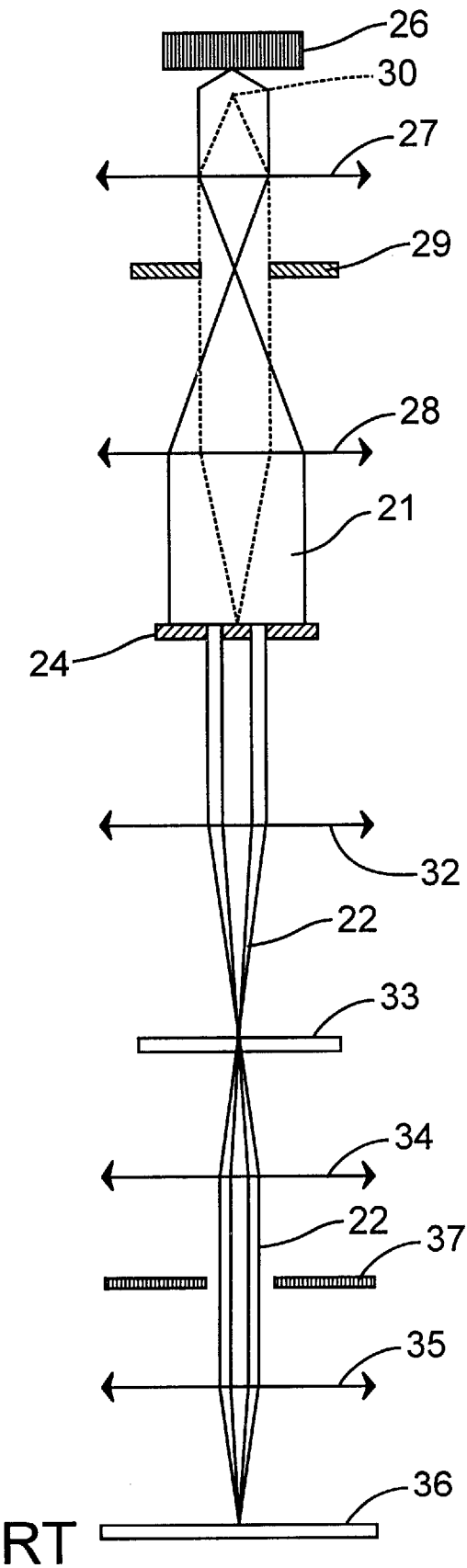
FIG. 5 depicts a conventional CPB microlithography system utilizing an annular aperture as shown in FIG. 4(b).

Alternatively to a plate with voids, the scattering aperture 4 can be configured as a ring-shaped (or analogous segmented-ring-shaped) opening 42 in a layer 43 of a CPB-scattering material on a thin, relatively CPB-transmissive membrane 45 (see FIGS. 3(c)–3(d)). The charged particle beam passes with little or no scattering through the opening 42 (and supporting CPB-transmissive membrane 45 (arrow 46), but is blocked (highly scattered, arrow 47) by the CPB-scattering material 43. The respective materials and thicknesses of the CPB-scattering material 43 and membrane 45 are similar to materials and thicknesses that would be used in a so-called "scattering-membrane" reticle as known in the art. Although this alternative configuration exhibits, with respect to the beam passing through the opening 42, greater dispersion of beam energy than exhibited by passage of the beam through actual voids, this alternative configuration (FIGS. 3(c)–3(d)) allows the opening 42 to be a complete ring (donut-shaped profile) as shown. Under some conditions, the beam passing through a scattering aperture 4 with a full-ring opening 42 (rather than a segmented-ring void such as shown in FIG. 1(b), 3(a), or 3(b)) exhibits less aberration.

Since particles of the hollow beam 2 that are scattered (by passage through the scattering aperture 4) are absorbed by the downstream blocking aperture 5, neither the scattering aperture 4 nor the blocking aperture 5 reach high temperatures during use. Therefore, the scattering aperture 4 can be formed from a material such as silicon that is micromachined easily. Also, the blocking aperture 5 can be made with a relatively large thickness. As a result, the problems inherent to the apparatus disclosed in JP Hei 11-297610 are solved while exploiting the advantages of that apparatus.

The thermal load on the scattering aperture 4 can be alleviated further by passing the beam through a current-absorbing aperture before the beam enters the scattering aperture 4.

Semiconductor devices can be manufactured having high resolution and high transfer accuracy using an apparatus according to the invention.

Whereas the invention has been described in connection with a representative and alternative embodiments, it will be apparent that the invention is not limited to those embodiments. On the contrary, the invention encompasses all modifications, alternatives, and equivalents as may be included within the spirit and scope of the invention, as defined by the appended claims.

What is claimed is:

1. In a charged-particle-beam microlithography apparatus that irradiates a pattern-defining reticle with a charged particle beam passing through an illumination-optical system such that particles of the beam pass through the reticle, and that passes the beam transmitted through the reticle through a projection-optical system so as to projection-transfer the reticle pattern onto a wafer, a system for producing a hollow beam, comprising:

a scattering aperture situated at a crossover-image plane of the illumination-optical system, the scattering aperture being configured as one or more openings defined in a layer of beam-scattering material, the openings being arranged to have, collectively, a first radius equal to a radius of a central region of the scattering aperture and a second radius greater than the first radius so as to produce a hollow beam downstream of the scattering aperture as the beam passes through the openings; and a blocking aperture situated between the scattering aperture and the reticle, the blocking aperture being configured as a plate defining a central opening, the plate being configured to absorb charged particles of the beam that were scattered by passage through the scattering aperture.

2. The system of claim 1, further comprising a current-limiting aperture upstream of the scattering aperture, the current-limiting aperture being configured to pre-absorb particles of the charged particle beam at an edge of the beam.

3. The system of claim 1, further comprising a scattered-particle-absorbing aperture, configured as a particle-absorbing plate defining a central void, and configured to be situated between the blocking aperture and the reticle.

4. A charged-particle-beam microlithography apparatus comprising the system of claim 1.

5. A method for manufacturing a semiconductor device, comprising performing projection-transfer of a pattern, defined by a reticle, onto a wafer using a charged-particle-beam microlithography apparatus as recited in claim 4.

6. The system of claim 1, wherein the scattering aperture is configured as voids defined in a beam-scattering plate.

7. The system of claim 6, wherein the voids collectively define a profile that is substantially ring-shaped.

8. The system of claim 1, wherein the scattering aperture is configured as an opening in a layer of charged-particle-beam-scattering material on a relatively charged-particle-beam-transmissive membrane.

9. The system of claim 8, wherein the opening is ring-shaped.

* * * * *